(12) United States Patent
Fischer et al.

(10) Patent No.: US 11,005,447 B2
(45) Date of Patent: May 11, 2021

(54) MICROELECTRONIC DEVICES HAVING VERTICAL PIEZOELECTRIC MEMBRANES FOR INTEGRATED RF FILTERS

(71) Applicant: Intel Corporation, Santa Clara, CA (US)

(72) Inventors: Paul B. Fischer, Portland, OR (US); Marko Radosavljevic, Portland, OR (US); Sansaptak Dasgupta, Hillsboro, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 16/346,099

(22) PCT Filed: Dec. 22, 2016

(86) PCT No.: PCT/US2016/068352
§ 371 (c)(1),
(2) Date: Apr. 29, 2019

(87) PCT Pub. No.: WO2018/118069
PCT Pub. Date: Jun. 28, 2018

(65) Prior Publication Data
US 2019/0260342 A1    Aug. 22, 2019

(51) Int. Cl.
*H03H 9/17* (2006.01)
*H03H 3/04* (2006.01)
*H03H 3/02* (2006.01)

(52) U.S. Cl.
CPC .......... *H03H 9/172* (2013.01); *H03H 3/02* (2013.01); *H03H 3/04* (2013.01); *H03H 2003/023* (2013.01); *H03H 2003/027* (2013.01)

(58) Field of Classification Search
CPC ............ H03H 3/04; H03H 3/02; H03H 9/172; H03H 2003/023; H03H 2003/027
USPC ........................................................ 333/187
See application file for complete search history.

(56) References Cited

U.S. PATENT DOCUMENTS

| 9,013,089 B2* | 4/2015 | Tsai .................... H03H 3/0072 310/321 |
| 2005/0030128 A1 | 2/2005 | Ma et al. |
| 2006/0017523 A1 | 1/2006 | Bhave et al. |
| 2006/0044078 A1 | 3/2006 | Ayazi et al. |

(Continued)

OTHER PUBLICATIONS

"Semiconductor and Optoelectronics", Prof. V. Krishnan, Department of Physics, Periyar University, Salem-636011 India (Year: 2019).*

(Continued)

*Primary Examiner* — Benny T Lee
*Assistant Examiner* — Hafizur Rahman
(74) *Attorney, Agent, or Firm* — Schwabe, Williamson & Wyatt P.C.

(57) ABSTRACT

Embodiments of the invention include microelectronic devices, resonators, and methods of fabricating the microelectronic devices. In one embodiment, a microelectronic device includes a substrate and a plurality of cavities integrated with the substrate. A plurality of vertically oriented resonators are formed with each resonator being positioned in a cavity. Each resonator includes a crystalline or single crystal piezoelectric film.

20 Claims, 7 Drawing Sheets

(56) References Cited

U.S. PATENT DOCUMENTS

2010/0019869 A1     1/2010    Durand et al.
2014/0292155 A1    10/2014   Ballandras et al.

OTHER PUBLICATIONS

"Piezoelectric MEMS Resonator", chapter 1 on AlN thin film Processing and Basic Properties by Paul Muralt, Piezoelectric MEMS Resonator, Springer, Switzerland, 2017 (Year: 2017).*
Tamariz et al. "AlN grown on Si(111) by ammonia-molecular beam epitaxy in the 900-1200° C. temperature range", published in the Journal of Crystal Growth, Aug. 2017 (Year: 2017).*
International Preliminary Report on Patentability for International Patent Application No. PCT/US2016/068352 dated Jul. 4, 2019, 10 pgs.
International Search Report and Written Opinion for International Patent Application No. PCT/US2016/068352 dated Sep. 14, 2017, 13 pgs.

* cited by examiner

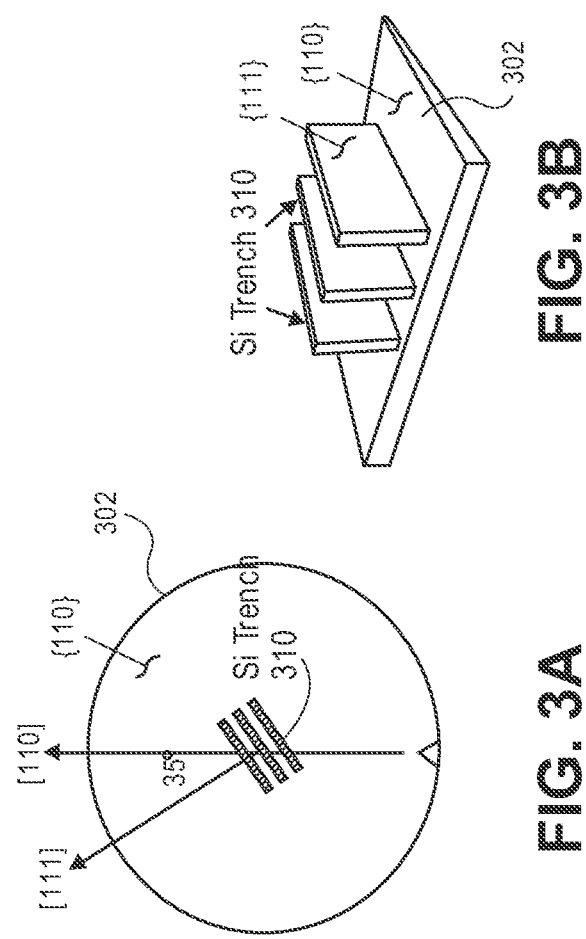

MICROELECTRONIC DEVICES HAVING VERTICAL PIEZOELECTRIC MEMBRANES FOR INTEGRATED RF FILTERS

CROSS-REFERENCE TO RELATED APPLICATION

This patent application is a U.S. National Phase Application under 35 U.S.C. § 371 of International Application No. PCT/US2016/068352, filed Dec. 22, 2016, entitled "MICROELECTRONIC DEVICES HAVING VERTICAL PIEZOELECTRIC MEMBRANES FOR INTEGRATED RF FILTERS," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microelectronic devices having vertical piezoelectric membranes for integrated RF filters.

BACKGROUND OF THE INVENTION

Modern RF front end filters include acoustic resonators in a film bulk acoustic resonator (FBAR) structure as illustrated in side view of FIG. 1A and top view of FIG. 1B. An acoustic filter is a circuit that includes at least 2 resonators and typically many more filters. FBAR devices are horizontal devices. Polycrystalline piezoelectric material is sputtered to form the piezoelectric film that is illustrated in FIG. 1A. A low loss device requires subsequent film smoothing before an upper electrode is deposited. CMP and ion milling are examples of technology used for smoothing after a sputter process. A piezoelectric thickness determines an operating frequency of the acoustic filter. The film thickness control needs to be precise for setting the operating frequency. Ion beam milling is used to compensate for within wafer thickness variation of the piezoelectric layer. Thickness tuning of each FBAR devices makes manufacturing of multiple filters on a common die difficult. Most commercial products feature only one filter per die. A 4G LTE wireless design may contain 40 filters or more. Estimates for 5G wireless designs can be as high as 140 filters due to having a highly fragmented frequency spectrum.

BRIEF DESCRIPTION OF THE DRAWINGS

FIG. 3A illustrates a top view of a substrate 302 and FIG. 3B illustrates a side view of the substrate after an etch in accordance with one embodiment.

DETAILED DESCRIPTION OF THE INVENTION

Figure 1A:
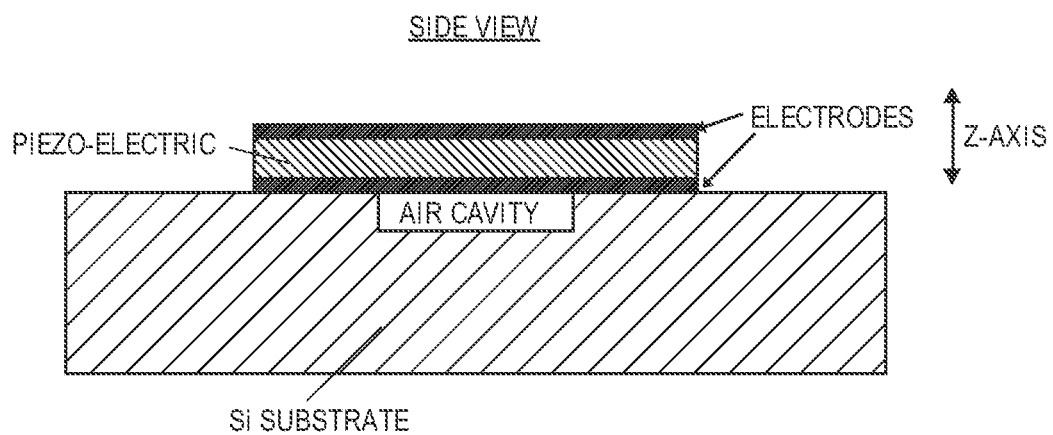
FIGS. 1A and 1B illustrate a film bulk acoustic resonator (FBAR) structure.
Figure 1B:
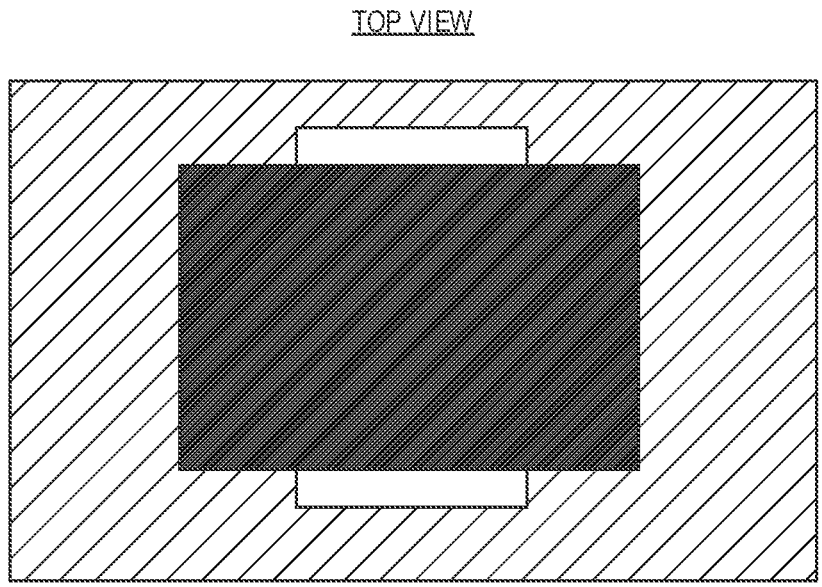

Described herein are microelectronic devices having vertical piezoelectric membranes for integrated RF filters. In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order to not obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

Electronic connections between the electronic devices (e.g., transistors) in an integrated circuit (IC) chip are currently typically created using copper metal or alloys of copper metal. Devices in an IC chip can be placed not only across the surface of the IC chip but devices can also be stacked in a plurality of layers on the IC chip. Electrical interconnections between electronic devices that make up the IC chip are built using vias and trenches that are filled with conducting material. Layer(s) of insulating materials, frequently, low-k dielectric materials, separate the various components and devices in the IC chip. The substrate on which the devices of the IC circuit chip are built is, for example, a silicon wafer or a silicon-on-insulator substrate. Silicon wafers are substrates that are typically used in the semiconductor processing industry, although embodiments of the invention are not dependent on the type of substrate used. The substrate could also be comprised of germanium, indium antimonide, lead telluride, indium arsenide, indium phosphide, gallium arsenide, gallium antimonide, and or other Group III-V materials either alone or in combination with silicon or silicon dioxide or other insulating materials. IC devices that make up the chip are built on the substrate surface.

The present design features innovations to enable power efficient, small form factor (e.g., less than 100 microns by 100 microns in a substrate plane, less than 5 microns by 100 microns in a substrate plane, etc.) filters for RF front end modules that include all circuitry between an antenna up to and including a mixer stage. An RF front end module may include RF filters, RF amplifiers, a mixer stage, and a local oscillator. The present design includes epitaxial growth of piezoelectric material (e.g., crystalline AlN) for higher quality piezoelectric film, lithographically controlled film thickness, vertically oriented resonators for higher packing density per die, and a crystal graphically defined surface template for epitaxial growth of the piezoelectric material.

Vertical cavities with lithographically defined widths enable precise control of piezoelectric thickness to nanometer (nm) resolution. This enables multiple frequencies to be patterned on a common die without costly precision trimming of thickness of each individual resonator. Vertical cavities also enable higher area packing density for smaller die area. Crystallographic wet etch of Si is used to create an atomically smooth sidewall template for a piezoelectric surface. This enables a lowest loss interface to improve resonator quality factor which in turn enables low insertion loss filters. Epitaxial growth of the piezoelectric layer creates a highly crystalline or single crystal film having one orientation which eliminates phonon scattering at grain boundaries and can enhance coupling coefficient. The end result is improvement in Q factor for resonators.

Figure 2:
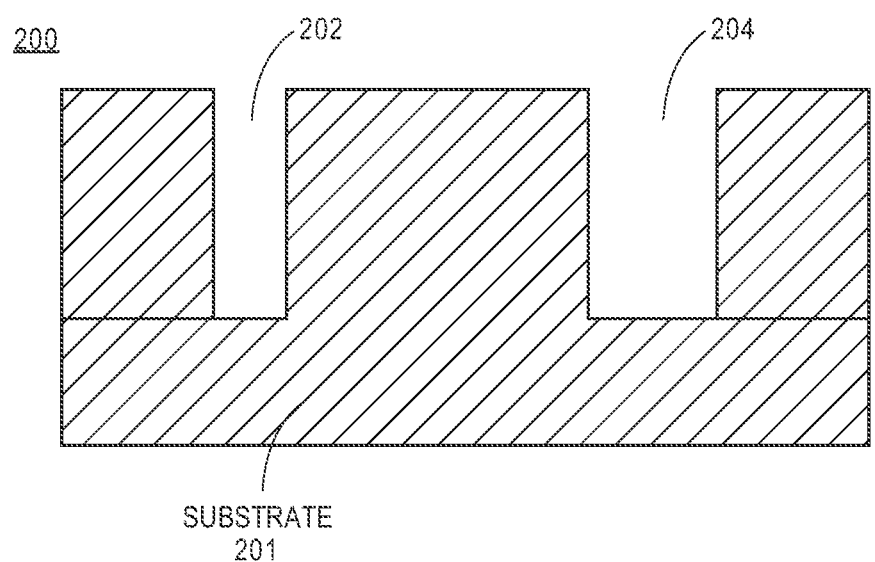
FIG. 2 illustrates a microelectronic device having a substrate for forming vertical piezoelectric membranes for integrated RF filters in accordance with one embodiment.

FIGS. 2-7 illustrate a process for fabricating microelectronic devices having vertical piezoelectric membranes for integrated RF filters in accordance with one embodiment. In FIG. 2, a microelectronic device 200 includes a substrate (e.g., a silicon substrate) 201 that is patterned and etched to form vertical cavities 202 and 204. In one example, a resist layer is patterned with lithography to create an etch masking layer. The cavities are then etched with reactive ion etching techniques and then a final etch (e.g., KOH wet etch) is performed to preferentially select specific crystal planes with low etch rates (e.g., <111>planes in Silicon). By aligning a trench pattern on the substrate, specific planes can be selected. This process can be applied to preferentially stop on <110>plane orientation. In one example, a KOH wet etch has etch rates in Silicon in which the <100>plane orientation etches faster than the <110>plane orientation which etches faster than the <111>plane orientation.

FIG. 3A illustrates a top view of a substrate 302 and FIG. 3B illustrates a side view of the substrate after an etch in accordance with one embodiment. In one embodiment, the substrate has a <110>as illustrated in FIG. 3A and 3B. Silicon trenches 310 are formed in the <111>plane orientation. FIG. 3B illustrates a side view of the plane orientations <110>, <111>, and <110>of the substrate 302.

Figure 4B:
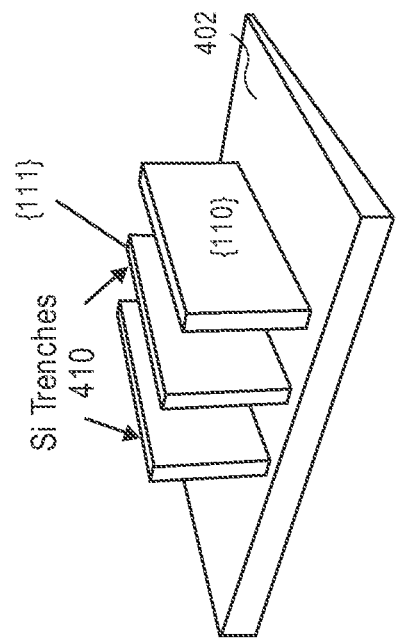
FIG. 4A illustrates a top view of a substrate 402 and FIG. 4B illustrates a side view of the substrate after an etch in accordance with another embodiment.
Figure 4A:
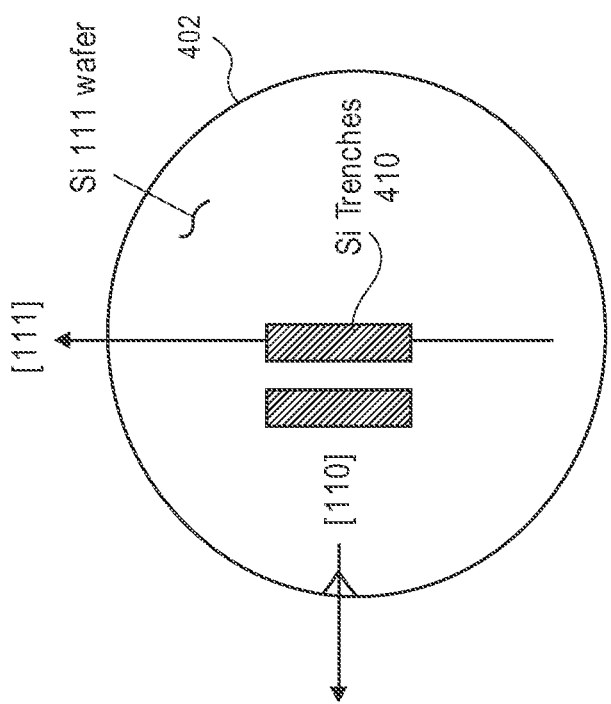

FIG. 4A illustrates a top view of a substrate 402 and FIG. 4B illustrates a side view of the substrate after an etch in accordance with one embodiment. In one embodiment, the substrate has a <110>as illustrated in FIG. 4A and 4B. Silicon trenches 410 are formed in the <111>plane orientation.

Figure 5:
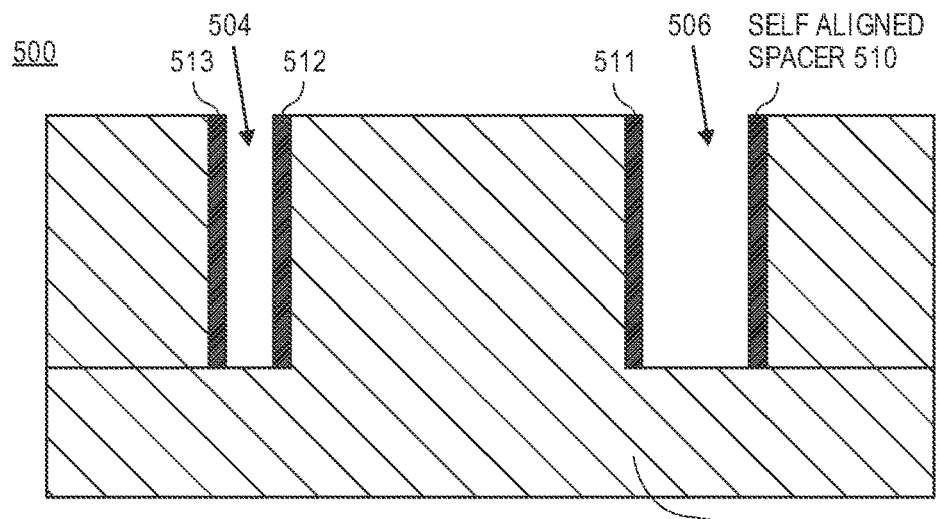
FIG. 5 illustrates a cross-sectional view of a microelectronic device 500 having cavities with self aligned spacers in accordance with one embodiment.

FIG. 5 illustrates a cross-sectional view of a microelectronic device 500 having cavities with self aligned spacers in accordance with one embodiment. A self align spacer film 510-513 (e.g., nitride, oxide, oxynitride, etc.) is formed on sidewalls of the cavities 504 and 506. The film may have any appropriate thickness (e.g., 1 microns, 0.5 to 2 microns) to define a width for metal electrodes for a particular acoustic application.

Figure 6:
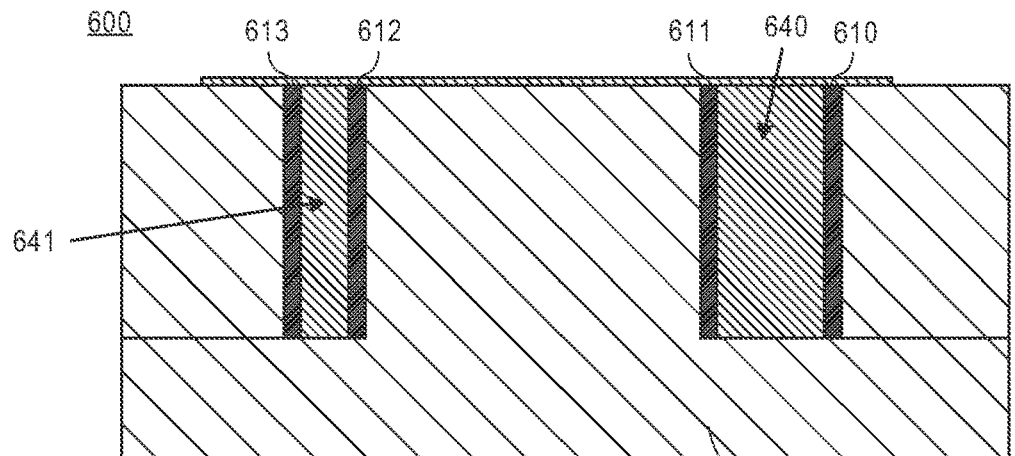
FIG. 6 illustrates a cross-sectional view of a microelectronic device 600 having cavities with spacers 610-613 and piezoelectric material in accordance with one embodiment.

FIG. 6 illustrates a cross-sectional view of a microelectronic device 600 having cavities with spacers 610-613 and piezoelectric material in accordance with one embodiment. A piezoelectric film 640 and 641 is epitaxially grown on exposed surfaces of the substrate 602. In one example, exposed Silicon crystal surfaces are a template for crystal growth of the piezoelectric film (e.g., AlN film). If an excess piezoelectric film protrudes above the trenches or the film is grown on an upper surface of the substrate surface, then the piezoelectric film can be ground or polished away.

Figure 7:
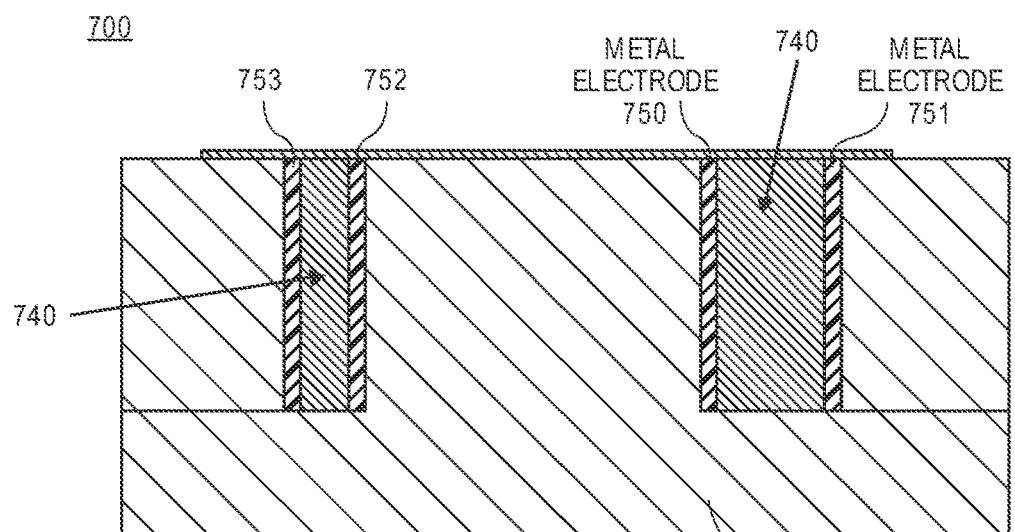
FIG. 7 illustrates a cross-sectional view of a microelectronic device 700 having cavities with conductive electrodes 750-753 and piezoelectric material in accordance with one embodiment.

FIG. 7 illustrates a cross-sectional view of a microelectronic device 700 having cavities with conductive electrodes 750-753 and piezoelectric material in accordance with one embodiment. The spacers 610-613 are replaced with the conductive electrodes 750-753. In one example, the spacers are selectively etched and then subsequently a metal deposition (e.g., Tungsten(W), Molybdenur (Mo), Aluminum (Al), etc.) and planarization operation (e.g., chemical mechanical planarization) occur resulting in the conductive metal electrodes 750-753 as illustrated in FIG. 7. The metal can be chosen for a particular application with Tungsten, Molybdenur, and Aluminum being used for acoustic resonators due to desired acoustic properties. The metal may have any appropriate thickness (e.g., 1 microns, 0.5 to 2 microns) for a particular acoustic application.

Depending an actual dimensions and aspect ratio (e.g., up to an aspect ratio of 100:1) of the trench (e.g., trench depth of up to 200 microns), a sputter deposition may be difficult for the metal deposition. In this case, vapor deposition techniques (e.g., chemical vapor deposition, atomic layer deposition, etc.) may be used to deposition W, Al, and numerous other suitable metals (e.g., Ruthenium) that have good acoustic properties.

Figure 8:
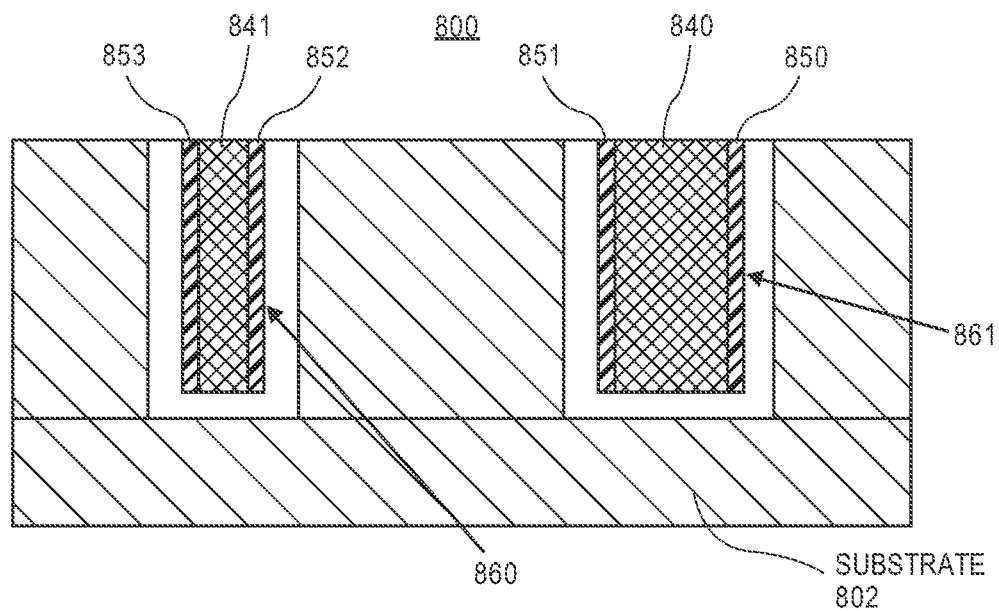
FIG. 8 illustrates a cross-sectional view of a microelectronic device 800 having cavities with conductive electrodes 850-853 and piezoelectric material in accordance with one embodiment.

FIG. 8 illustrates a cross-sectional view of a microelectronic device 800 having cavities with conductive electrodes 850-853 and piezoelectric material in accordance with one embodiment. In one example, the conductive electrodes 850-853 and piezoelectric material 840 and 841 are released from a bottom surface of the cavities. In one example, a lithographically defined etch mask, anisotropic selective dry etch, and an isotropic etch are performed to release a bottom of the resonators 860 and 861 as illustrated in FIG. 8.

Figure 9:
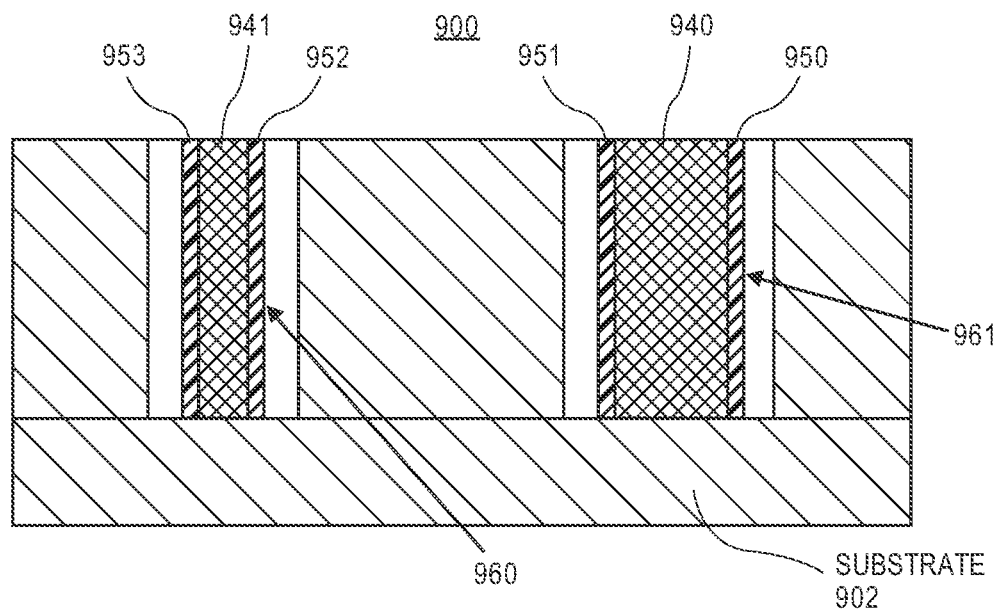
FIG. 9 illustrates a cross-sectional view of a microelectronic device 1000 having cavities with conductive electrodes 950-953 and piezoelectric material in accordance with one embodiment.

FIG. 9 illustrates a cross-sectional view of a microelectronic device 900 having cavities with conductive electrodes 950-953 and piezoelectric material in accordance with one embodiment. In one example, the conductive electrodes 950-953 and piezoelectric material 940 and 941 are released from sidewalls of the cavities of the substrate 903. In this example, a lithographically defined etch mask and an isotropic etch are performed to release the resonators 960 and 961 from sidewalls of the cavities while remaining attached to a bottom surface of the cavities as illustrated in FIG. 9.

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. In other implementations, the microelectronics device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 10:
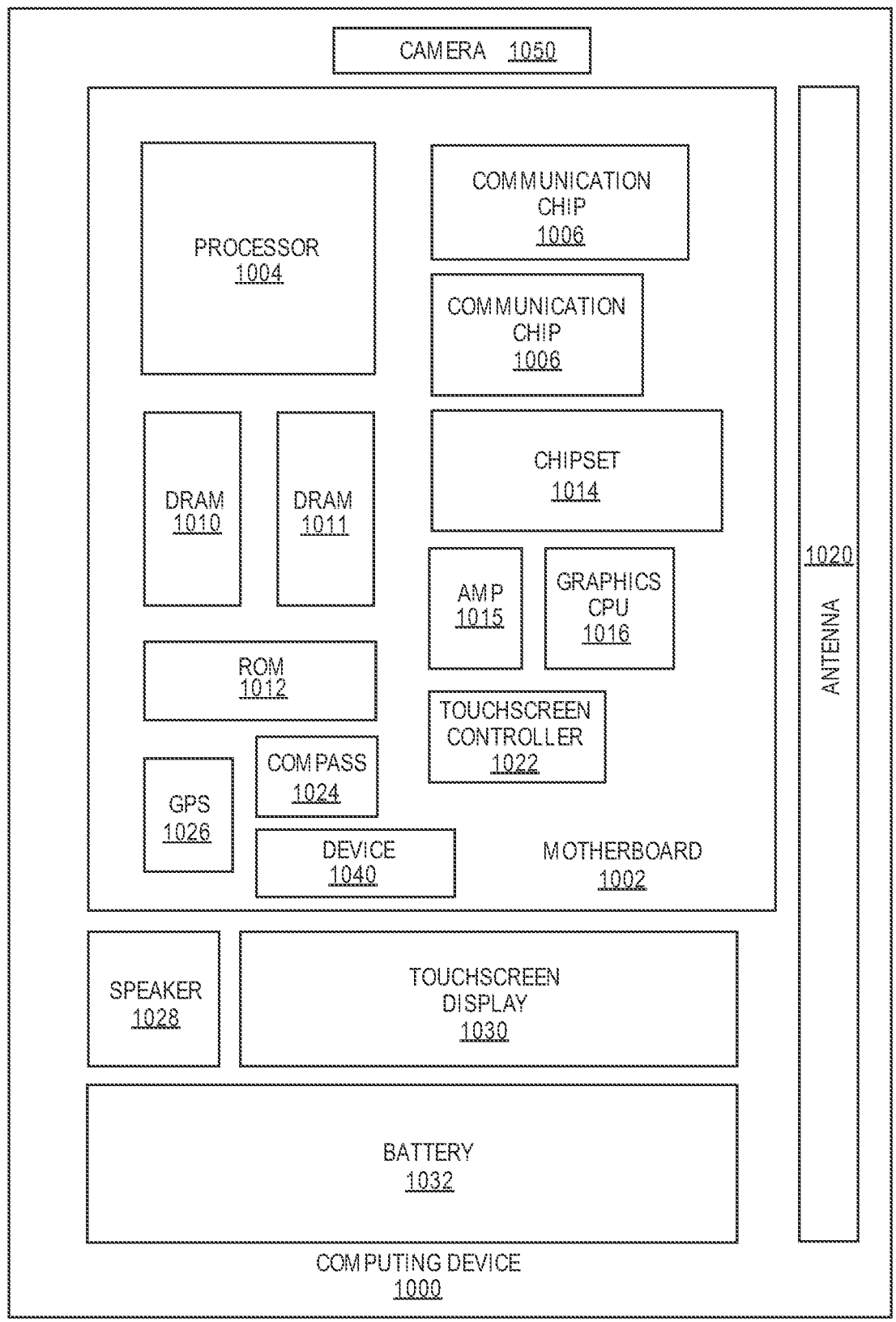
FIG. 10 illustrates a computing device 1000 in accordance with one embodiment of the invention.

FIG. 10 illustrates a computing device 1000 in accordance with one embodiment of the invention. The computing device 1000 houses a board 1002. The board 1002 may include a number of components, including but not limited to at least one processor 1004 and at least one communication chip 906. The at least one processor 1004 is physically and electrically coupled to the board 1002. In some implementations, the at least one communication chip 1006 is also physically and electrically coupled to the board 1002. In further implementations, the communication chip 1006 is part of the processor 1004. In one example, any of the components of the computing device include at least one microelectronic device (e.g., microelectronic device 200, 500, 600, 700, 800, 900) having cavities with integrated resonators (e.g., resonators 860, 861, 960, 961). The computing device 1000 may also include a separate microelectronic device 1040 (e.g., microelectronic device 200, 500, 600, 700, 800, 900).

Depending on its applications, computing device 1000 may include other components that may or may not be physically and electrically coupled to the board 1002. These other components include, but are not limited to, volatile memory (e.g., DRAM 1010, 1011), non-volatile memory (e.g., ROM 1012), flash memory, a graphics processor 1016, a digital signal processor, a crypto processor, a chipset 1014, an antenna unit 1020, a display, a touchscreen display 1030, a touchscreen controller 1022, a battery 1032, an audio codec, a video codec, a power amplifier 1015, a global positioning system (GPS) device 1026, a compass 1024, a gyroscope, a speaker, a camera 1050, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi, WiGig, and Bluetooth and a second communication chip 1006 may be dedicated to longer range wireless communications such as GPS, EDGE, GPRS, CDMA, WiMAX, LTE, Ev-DO, 5G, and others.

The at least one processor 1004 of the computing device 1000 includes an integrated circuit die packaged within the at least one processor 1004. In some implementations of embodiments of the invention, the integrated circuit die of the processor includes one or more devices, such as microelectronic devices (e.g., microelectronic device 200, 500, 600, 700, 800, 900, etc.) in accordance with implementations of embodiments of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of embodiments of the invention, the integrated circuit die of the communication chip includes one or more microelectronic devices (e.g., microelectronic device 200, 500, 600, 700, 800, 900, etc.).

The following examples pertain to further embodiments. Example 1 is a microelectronic device that includes a substrate, a plurality of cavities integrated with the substrate, and a plurality of vertically oriented resonators with each resonator being positioned in a cavity. Each resonator includes a crystalline piezoelectric film.

In example 2, the subject matter of example 1 can optionally include each resonator further comprising a first conductive electrode in contact with a first side of the piezoelectric film and a second conductive electrode in contact with a second side of the piezoelectric film.

In example 3, the subject matter of any of examples 1-2 can optionally include the piezoelectric film comprising a crystalline group III Nitride layer.

In example 4, the subject matter of any of examples 1-3 can optionally include the vertically oriented resonators provide a reduced form factor that is less than 100 microns by 100 microns in area.

In example 5, the subject matter of any of examples 1-4 can optionally include the substrate that comprises a Silicon substrate having cavities with atomically smooth surfaces for epitaxial growth of the crystalline piezoelectric film.

In example 6, the subject matter of any of examples 1-5 can optionally include the plurality of cavities being lithographically defined to enable precise control of widths of the crystalline and this allows multiple resonator frequencies to be fabricated on the substrate without precision trimming of a thickness of each individual resonator.

In example 7, the subject matter of any of examples 1-6 can optionally include each resonator being released without contacting a lower surface of a respective cavity.

In example 8, the subject matter of any of examples 1-6 can optionally include each resonator being released without contacting sidewalls of a respective cavity.

Example 9 is a vertically oriented resonator comprising a crystalline piezoelectric film and a first conductive electrode in contact with a first side of the piezoelectric film and a second conductive electrode in contact with a second side of the piezoelectric film. The vertically oriented resonator is positioned in a cavity of a substrate.

In example 10, the subject matter of example 9 can optionally include the piezoelectric film comprising a crystalline group III Nitride layer.

In example 11, the subject matter of any of examples 9-10 can optionally include the piezoelectric film comprising a crystalline Aluminum Nitride layer.

In example 12, the subject matter of any of examples 9-11 can optionally include the vertically oriented resonator that provides a reduced form factor that is less than 100 microns by 100 microns in area.

In example 13, the subject matter of any of examples 9-12 can optionally include the vertically oriented resonator that provides a reduced form factor that is approximately 4 microns by 100 microns in area.

In example 14, the subject matter of any of examples 9-13 can optionally include the cavity that has atomically smooth surfaces for epitaxial growth of the crystalline piezoelectric film.

In example 15, the subject matter of any of examples 9-14 can optionally include the resonator that is released without contacting a lower surface of the cavity.

In example 16, the subject matter of any of examples 9-15 can optionally include the resonator that is released without contacting sidewalls of the cavity.

Example 17 is a method comprising providing a substrate having a plurality of cavities, epitaxially growing a crystalline piezoelectric film from a lower surface of each cavity, depositing a conductive layer on each side of the piezoelectric film, and releasing the crystalline piezoelectric film to form an acoustic resonator in each cavity.

In example 18, the subject matter of example 17 can optionally include forming self aligned spacers on sidewalls of the cavities and removing the self aligned spacers prior to depositing the conductive layer on each side of the piezoelectric film.

In example 19, the subject matter of any of examples 17-18 can optionally include the piezoelectric film that comprises a crystalline group III Nitride layer.

In example 20, the subject matter of any of examples 17-19 can optionally include the substrate that comprises a Silicon substrate having cavities with atomically smooth surfaces for epitaxial growth of the crystalline piezoelectric film.

In example 21, the subject matter of any of examples 17-20 can optionally include the plurality of cavities that are lithographically defined to enable precise control of widths of the crystalline piezoelectric film and this allows multiple resonator frequencies to be fabricated on the substrate without precision trimming of a thickness of each individual resonator.

The invention claimed is:

1. A microelectronic device comprising:
a substrate;
a plurality of cavities integrated within the substrate; and
a plurality of vertically oriented resonators with each resonator being positioned in a respective cavity, each resonator includes a crystalline piezoelectric film, wherein a portion of each resonator does not contact a lower surface of the respective cavity.

2. The microelectronic device of claim 1, wherein each resonator further comprises a first conductive electrode in contact with a first side of the piezoelectric film and a second conductive electrode in contact with a second side of the piezoelectric film.

3. The microelectronic device of claim 1, wherein the piezoelectric film comprises a crystalline group III Nitride layer.

4. The microelectronic device of claim 1, wherein the vertically oriented resonators provide a reduced form factor that is less than 100 microns by 100 microns in area.

5. The microelectronic device of claim 1, wherein the substrate comprises a Silicon substrate having the plurality of cavities with atomically smooth surfaces for epitaxial growth of the crystalline piezoelectric film.

6. The microelectronic device of claim 1, wherein the plurality of cavities are lithographically defined to enable precise control of widths of the crystalline piezoelectric film which allows multiple resonator frequencies to be fabricated on the substrate without precision trimming of a thickness of each individual resonator.

7. The microelectronic device of claim 1, wherein each resonator is released without contacting sidewalls of a respective cavity.

8. A microelectronic device comprising:
a substrate;
a plurality of cavities integrated within the substrate; and
a plurality of vertically oriented resonators with each resonator being positioned in a respective cavity, each resonator includes a crystalline piezoelectric film, wherein the vertically oriented resonators provide a reduced form factor that is less than 100 microns by 100 microns in area.

9. A vertically oriented resonator comprising:
a crystalline piezoelectric film; and
a first conductive electrode in contact with a first side of the piezoelectric film and a second conductive electrode in contact with a second side of the piezoelectric film, the vertically oriented resonator being positioned in a cavity of a substrate, wherein a portion of the resonator does not contact a lower surface of the cavity.

10. The vertically oriented resonator of claim 9, wherein the piezoelectric film comprises a crystalline group III Nitride layer.

11. The vertically oriented resonator of claim 9, wherein the piezoelectric film comprises a crystalline Aluminum Nitride layer.

12. The vertically oriented resonator of claim 9, wherein the vertically oriented resonator provides a reduced form factor that is less than 100 microns by 100 microns in area.

13. The vertically oriented resonator of claim 9, wherein the vertically oriented resonator provides a reduced form factor that is approximately 4 microns by 100 microns in area.

14. The vertically oriented resonator of claim 9, wherein the cavity has atomically smooth surfaces for epitaxial growth of the crystalline piezoelectric film.

15. The vertically oriented resonator of claim 9, wherein the resonator is released without contacting sidewalls of the cavity.

16. A method comprising:
providing a substrate having a plurality of cavities;
epitaxially growing a crystalline piezoelectric film from a lower surface of each cavity;
depositing a conductive layer on each side of the piezoelectric film; and
releasing the crystalline piezoelectric film to form an acoustic resonator in each cavity.

17. The method of claim 16, wherein the plurality of cavities are lithographically defined to enable precise control of widths of the crystalline piezoelectric film which allows multiple resonator frequencies to be fabricated on the substrate without precision trimming of a thickness of each individual resonator.

18. The method of claim 16, further comprising:
forming self aligned spacers on sidewalls of the cavities; and
removing the self aligned spacers prior to depositing the conductive layer on each side of the piezoelectric film.

19. The method of claim 16, wherein the piezoelectric film comprises a crystalline group III Nitride layer.

20. The method of claim 16, wherein the substrate comprises a Silicon substrate having the plurality of cavities with atomically smooth surfaces for epitaxial growth of the crystalline piezoelectric film.

* * * * *